(12) United States Patent
Hagelaar et al.

(10) Patent No.: US 11,178,735 B2
(45) Date of Patent: Nov. 16, 2021

(54) LED LIGHT STRIP AND METHOD FOR MANUFACTURING THE SAME

(71) Applicant: SIGNIFY HOLDING B.V., Eindhoven (NL)

(72) Inventors: Joris Hubertus Antonius Hagelaar, Nuenen (NL); Aart Jan Vroegop, Zaltbommel (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/572,703

(22) PCT Filed: May 2, 2016

(86) PCT No.: PCT/EP2016/059778
§ 371 (c)(1),
(2) Date: Nov. 8, 2017

(87) PCT Pub. No.: WO2016/180656
PCT Pub. Date: Nov. 17, 2016

(65) Prior Publication Data
US 2018/0112861 A1 Apr. 26, 2018

(30) Foreign Application Priority Data
May 8, 2015 (EP) .................................... 15167020

(51) Int. Cl.
*H05B 45/00* (2020.01)
*H05K 1/02* (2006.01)
(Continued)

(52) U.S. Cl.
CPC ................ *H05B 45/00* (2020.01); *F21S 4/22* (2016.01); *F21V 23/001* (2013.01);
(Continued)

(58) Field of Classification Search
CPC .................................................. H05B 33/0806
See application file for complete search history.

(56) References Cited

U.S. PATENT DOCUMENTS

| 5,808,592 | A * | 9/1998 | Mizutani | ................... G09F 9/33 |
| | | | | 257/E25.028 |
| 8,123,375 | B2 * | 2/2012 | Negley | ..................... G09F 9/35 |
| | | | | 362/231 |

(Continued)

FOREIGN PATENT DOCUMENTS

| WO | 2013058995 A1 | 4/2013 | |
| WO | WO-2014177409 A1 * | 11/2014 | ......... H05B 33/0827 |

OTHER PUBLICATIONS

Electronics Tutorial about Light Emitting Diodes, https://www.electronics-tutorials.we/diode/diode_8.html, Mar. 27, 2009.*

*Primary Examiner* — Alexander K Garlen
*Assistant Examiner* — Colin J Cattanach

(57) ABSTRACT

The present invention provides a light emitting diode(s), LED, light strip arranged for providing improved color consistency over its length. The LED light strip comprises LED strings positioned along the length of the LED light strip and powered in parallel, for emitting, for example, red, green, blue and white light. The resistance of the supply and return traces, in combination with variations in the current drawn by or the forward voltage of the various LED and resistors used in the LED strings of different color, causes a voltage drop along these traces leading to inconsistent color rendering. By adjusting the resistivity of the traces, such as through providing return paths having different resistances for LED strings of different color, the consistency of the color rendering can be improved.

18 Claims, 5 Drawing Sheets

(51) Int. Cl.
*H05B 45/40* (2020.01)
*F21S 4/22* (2016.01)
*F21V 23/00* (2015.01)
*H05K 1/03* (2006.01)
*H05K 1/18* (2006.01)
*H05K 3/12* (2006.01)
*H05K 3/30* (2006.01)
*F21Y 113/13* (2016.01)
*F21Y 103/10* (2016.01)
*F21Y 115/10* (2016.01)

(52) U.S. Cl.
CPC ........... *F21V 23/005* (2013.01); *H05B 45/40* (2020.01); *H05K 1/025* (2013.01); *H05K 1/0393* (2013.01); *H05K 1/181* (2013.01); *H05K 3/12* (2013.01); *H05K 3/303* (2013.01); *F21Y 2103/10* (2016.08); *F21Y 2113/13* (2016.08); *F21Y 2115/10* (2016.08); *H05K 1/189* (2013.01); *H05K 2201/09727* (2013.01); *H05K 2201/09736* (2013.01); *H05K 2201/10106* (2013.01)

(56) References Cited

U.S. PATENT DOCUMENTS

| | | | |
|---|---|---|---|
| 9,089,018 B2* | 7/2015 | Tischler | H05B 33/0821 |
| 9,549,447 B2* | 1/2017 | Peeters | H05B 33/0827 |
| 2005/0047167 A1* | 3/2005 | Pederson | B60Q 1/2611 |
| | | | 362/542 |
| 2005/0057941 A1* | 3/2005 | Pederson | B60Q 1/2611 |
| | | | 362/542 |
| 2006/0226795 A1* | 10/2006 | Walter | H05B 33/0803 |
| | | | 315/312 |
| 2007/0013620 A1* | 1/2007 | Tanahashi | G09G 3/32 |
| | | | 345/82 |
| 2009/0154156 A1 | 6/2009 | Lo et al. | |
| 2009/0261743 A1* | 10/2009 | Chen | H05B 33/0815 |
| | | | 315/192 |
| 2011/0037409 A1* | 2/2011 | Van De Ven | H05B 33/086 |
| | | | 315/294 |
| 2011/0163682 A1* | 7/2011 | Jungwirth | H05B 33/0818 |
| | | | 315/192 |
| 2012/0002417 A1* | 1/2012 | Li | F21V 17/007 |
| | | | 362/249.02 |
| 2013/0141013 A1* | 6/2013 | Kodama | H05B 33/0857 |
| | | | 315/294 |
| 2013/0200790 A1* | 8/2013 | Stuffle | H05B 33/0821 |
| | | | 315/52 |
| 2013/0249417 A1 | 9/2013 | Verlinden | |
| 2014/0049172 A1* | 2/2014 | Bakk | H05B 33/0863 |
| | | | 315/192 |
| 2015/0108907 A1* | 4/2015 | Tischler | H05B 33/0821 |
| | | | 315/185 R |
| 2015/0260384 A1* | 9/2015 | Purdy | H05B 33/0845 |
| | | | 362/221 |
| 2015/0271881 A1* | 9/2015 | Trinschek | H05B 33/0806 |
| | | | 315/77 |

* cited by examiner

LED LIGHT STRIP AND METHOD FOR MANUFACTURING THE SAME

CROSS-REFERENCE TO PRIOR APPLICATIONS

This application is the U.S. National Phase application under 35 U.S.C. § 371 of International Application No. PCT/EP2016/059778, filed on May 2, 2016, which claims the benefit of European Patent Application No. 15167020.5, filed on May 8, 2015. These applications are hereby incorporated by reference herein.

FIELD OF THE INVENTION

The present invention relates to a light emitting diode(s), LED, light strip comprising at least two types of LED, to a system comprising a LED light strip and to a method for manufacturing a LED light strip.

BACKGROUND OF THE INVENTION

Light strips offer easy installation of a multitude of light sources to achieve a desirable light effect. Light emitting diode(s), LED, light strips are widely available and used for various applications, including architectural lighting and indoor lighting. Currently available LED light strips typically range from strips powered by a 12V voltage source, varying in length from 1-5 meters, to strips powered by a 24V voltage source, in lengths of over 5 meters. Certain LED light strips offer a feature where the LED light strip can be cut to a desired length. As these LED light strips are finding greater use, there is a need to provide light strips with an improved light output quality at a relatively low cost.

US2015/0108907 discloses an example of LED light strip according prior art.

SUMMARY OF THE INVENTION

The inventors have realized that there is a trend towards using light emitting diode(s), LED, light strips of greater length and that current designs of LED light strips cause inconsistent color rendering over their length which becomes visible to the human eye in LED light strips of greater length.

The current design of a LED light strip typically comprises a plurality of LED strings powered in parallel through a supply path and a return path. In such a design a LED string comprises multiple LED and a resistor. As the length of the LED light strip increases, the total number of LED strings in the LED light strip typically increases as well. This provides for a greater total light output of the LED strip and at the same time increases the currents traversing the supply and return paths. At these greater currents the resistances of the supply and return path have a measurable effect over the length of the LED light strip.

As an example only, for a LED light strip comprising LED of a single color, the current drawn by a LED light strip of five meters powered by a 12V source with 50 LED strings, each LED string comprising three LED and a resistor, can easily reach 2.5A. The supply and return path are each, in this example, a copper trace on a flexible printed circuit board, PCB, having a resistance of approximately $\frac{1}{10}$ Ohm per meter. As a result the voltage over the last LED string will not be 12V as for the first LED string, but 9.5V (a voltage drop of 0.25V per meter for each of the supply and the return trace). The LED strings in the LED light strip of this example would typically be made up out of three LED each having a forward voltage of 3V, and a resistor of 60 Ohm. The voltage over the resistor in the last LED string would be 0.5V compared to 3V over the resistor of the first LED string. As a result the current over the last LED string would be about six times lower (approx. 8.3 mA), than the current over the first LED string (50 mA), causing the last LED string to output considerably less light. The human eye cannot easily distinguish between flux levels however, and as such for a LED light strip with a single color this drop in flux level along the length of the LED light strip is acceptable for certain products.

When the LED light strip comprises LED strings with LED outputting different colors, then the effect of the lower flux at the end of the LED light strip can impact LED strings of various colors differently, causing a lack of color consistency along the LED light strip. In a LED light strip comprising red, green and blue LED, the red LED will typically have a lower forward voltage compared to the blue or green LED. When in such a LED light strip purple light is being rendered by controlling the LED strings comprising the blue LED and the LED strings comprising the red LED to output light, then the light output for the red LED strings decreases significantly less over the length of the LED strip than the light output of the blue LED strings. A color shift towards a more reddish purple therefore occurs over the length of the LED light strip (i.e. there is a relatively greater red component in the light rendered by the LED light strip at the end of the LED light strip compared to at the beginning of the LED light strip). This color difference is much more visible to the human eye and as such not acceptable for certain products.

According to a first aspect of the invention, a LED light strip is provided overcoming or diminishing at least some of the aforementioned issues. The LED light strip comprising:
   a first plurality of LED strings positioned along a length of the LED strip and arranged for being powered in parallel through a first supply path and a first return path, each LED string of the first plurality of LED strings comprising at least one LED of a first type of LED and at least one resistive component of a first type,
   a second plurality of LED strings positioned along the length of the LED strip and further arranged for being powered in parallel through a second supply path and a second return path, each LED string of the second plurality of LED strings comprising at least one LED of a second type of LED, different from the first type of LED, and at least one resistive component of a second type,
   at least three electrical conductors positioned along the length of the LED strip,
   wherein a first set of at least two electrical conductors of the at least three electrical conductors are arranged to provide the first supply path and the first return path for the first plurality of LED strings, and a second set of at least two electrical conductors of the at least three electrical conductors are arranged to provide the second supply path and the second return path for the second plurality of LED strings,
   wherein the first plurality of LED strings and the second plurality of LED strings have different electrical characteristics in at least one of a forward voltage of the LED comprised in the LED string and a drive current of the LED string; and
   wherein the three electrical conductors are arranged such that the resistance of the combined supply path and return path of a LED string of the first plurality of LED strings is different from the resistance of the combined supply path and return path of a LED string of the second plurality of LED strings.

In an embodiment of the LED light strip, the at least three electrical conductors are of the same material, and wherein the cross section area of at least one the at least three electrical conductors is different from the other electrical conductor(s) of the at least three electrical conductors. In a further embodiment, the three electrical conductors are traces on a printed circuit board, preferably a flexible printed circuit board, and the width of at least one the at least three electrical conductors is different from the other electrical conductor(s) of the at least three electrical conductors. In yet a further embodiment, the width of each electrical conductor of the at least three electrical conductors remains the same along the length of the LED light strip.

In an embodiment of the LED light strip a first electrical conductor of the at least three electrical conductors is both the first supply path as well as the second supply path, or alternatively the first return path as well as the second return path.

In an embodiment of the LED light strip the first plurality of LED strings comprise a LED type with a higher forward voltage than the LED type comprised in the second plurality of LED strings, and wherein the resistance of the combined supply path and return path of a LED string of the first plurality of LED strings is less than the resistance of the combined supply path and return path of a LED string of the second plurality of LED strings.

In an embodiment of the LED light strip the first plurality of LED strings has a higher drive current than the second plurality of LED strings, and wherein the resistance of the combined supply path and return path of a LED string of the first plurality of LED strings is greater than the resistance of the combined supply path and return path of a LED string of the second plurality of LED strings.

In an embodiment of the LED light strip the first type of LED is arranged for emitting a first color of light and the second type of LED is arranged for emitting a second color of light, different from the first color of light.

In an embodiment of the LED light strip the first type of LED is arranged for emitting white light, and wherein the first type of LED, when the LED light strip is powered, draws more current than the second type of LED.

In an embodiment of the LED light strip the first type of LED is arranged for emitting red light, and wherein the first type of LED, when the LED light strip is powered, has a lower forward voltage than the second type of LED.

According to another aspect, there is further provided a system comprising a LED light strip and further comprising a driver for powering the LED light strip.

According to another aspect, there is further provided a method of manufacturing a LED light strip, the method comprising:
  printing at least three traces on a circuit board, the at least three traces arranged for providing at least three electrical conductors positioned along the length of the LED strip,
  populating the circuit board with a least
    a first plurality of LED strings positioned along a length of the LED strip and arranged for being powered in parallel through a first supply path and a first return path, each LED string of the first plurality of LED strings comprising at least one LED of a first type and at least one resistive component of a first type,
    a second plurality of LED strings positioned along the length of the LED strip and further arranged for being powered in parallel through a second supply path and a second return path, each LED string of the second plurality of LED strings comprising at least one LED of a second type, different from the first type of LED, and at least one resistive component of a second type,
  wherein a first set of at least two electrical conductors of the at least three electrical conductors are arranged to provide the first supply path and the first return path for the first plurality of LED strings and a second set of at least two electrical conductors of the at least three electrical conductors are arranged to provide the second supply path and the second return path for the second plurality of LED strings,
  wherein the LED of a first type and the LED of a second type have different characteristics in at least one of a forward voltage of the LED and a drive current of the LED; and
  wherein the three electrical conductors are arranged such that the resistance of the combined supply path and return path of a LED string of the first plurality of LED strings is different from the resistance of the combined supply path and return path of a LED string of the second plurality of LED strings.

In an embodiment of the method, the three electrical conductors are of the same material, and wherein the dimensions, preferably the width, of each of the at least three electrical conductors is adapted such that the resistance of each of the at least three electrical conductors relative to the other of the at least three electrical conductors provides that the voltage drop over the first set of at least two electrical conductors matches the voltage drop over the second set of at least two electrical conductors.

It shall be understood that a preferred embodiment of the invention can also be any combination of the dependent claims or above embodiments with the respective independent claim. This includes arrangements comprising a driver module according to the first aspect of the invention and a further module, such as the communications module and/or the sensor module according to respectively the second and third aspects of the invention.

These and other aspects of the invention will be apparent from and elucidated with reference to the embodiments described hereinafter.

DETAILED DESCRIPTION OF EMBODIMENTS

Figure 1:
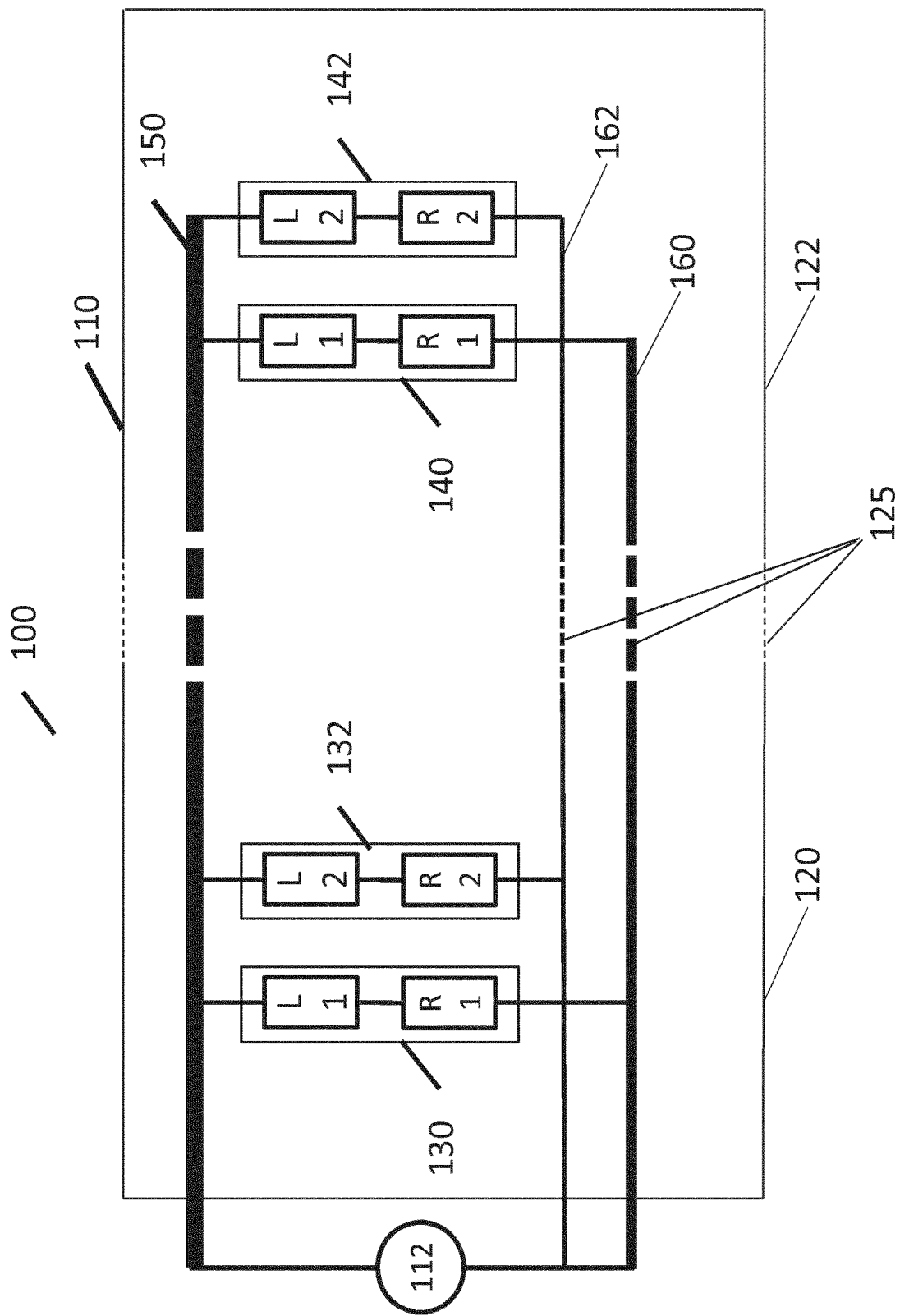
FIG. 1 shows schematically and exemplarily a LED light strip comprising two types of LED strings and three electrical conductors.

In FIG. 1 a lighting system 100 is shown comprising a LED light strip 110 and a voltage source 112. The LED light strip 110 is not shown in its entirety, but instead the first segment 120 and the final segment 122 of the LED light strip 110 are shown. Dotted lines 125 indicate the segment of the LED light strip which is not shown, i.e. the part of the LED light strip 110 between the first segment 120 and the last segment 122.

What is shown in FIG. 1 is the LED light strip 110 comprising a first and second LED string 130, 132 in the first LED light strip segment 120 and a first and second LED string 140, 142 in the final LED light strip segment 122. Typically these LED strings would also be found in the segment not shown 125. The two LED strings 130, 132 in the first segment 120 are of different types. The first LED string 130 comprising at least one LED L1 of a first type and at least one resistive element (e.g. a resistor) R1 of a first type, and the second LED string 132 comprises at least one LED L2 of a second type, different from L1, and at least one resistive element (e.g. a resistor) R2 of a second type. For example, the first LED string 130 comprises one or more white LED and the second LED string 132 comprises one or more blue LED; or as another example, the first LED string 130 comprises one or more red LED and the second LED string 132 comprises one or more green LED. The first LED string 140 in the final segment 122 is the same as the first LED string 130 in the first segment 120, and the second LED string 132 in the first segment 120 is the same as the second LED string 142 in the final segment 122. Although in this example only two types of LED string are shown, there can be more (e.g. a LED light strip comprising red, green, blue and white LED strings).

All LED strings 130, 132, 140, 142 are coupled to a supply path 150, which is an electrical conductor such as a trace on a (flexible) printed circuit board. The first type of LED string, i.e. the first LED string 130 in the first segment 120 and the first LED string 140 in the final segment 122, are each coupled to the first return path 160. The second type of LED string, i.e. the second LED string 132 in the first segment 120 and the second LED string 142 in the final segment 122, are each coupled to the second return path 162. This is just an example, as in another embodiment instead of a common supply path and separate return paths the various types of LED strings can have a common return path and separate supply paths, or in yet another embodiment each type of LED string has both its own supply path as well as its own return path. In an embodiment with more than two types of LED strings, there could be more supply paths and/or return paths and certain types of LED strings can share a first return path while other types of LED share a further return path.

For the purpose of understanding the application, assume that in the LED light strip 110 of FIG. 1 the resistance of the combined supply and return path for the first type of LED string 130, 140 is the same as the resistance of the combined supply and return path for the second type of LED string 132, 142; in other words that in this example the resistance of the electrical conductor forming the return path 160 is the same as the resistance of the electrical conductor forming the return path 162, the following effect occurs. The voltages over LED strings 140, 142 in the final segment 122 will be smaller than the respective voltages over the LED strings 130, 132 in the first segment 120; i.e. the voltage over LED string 140 will be lower than the voltage over LED string 130, and the voltage over LED string 142 will be lower than the voltage over LED string 132. This is at least due to the fact that the electrical conductors have a resistance. If we now further assume that the first LED strings 130 and 140, in respectively the first segment 120 and the final segment 122, draw more current than the second LED strings 132 and 142, the decrease in voltage over the second LED string 140, 142 versus the first LED string 130, 132 is relatively larger for the LED strings that draw more current. As a result, for an LED light strip 110 where in the first segment 120 the current running through the first LED string 130 is the same as the current running through the second LED string 132, the current running through the first LED string 140 and the second LED string 142 of the second segment 122 will not be the same. In another example the in the first segment 120 the current running through the first LED string 130 is twice the current running through the second LED string 132, the current running through the first LED string 140 and the second LED string 142 of the second segment 122 differs by a factor other than two.

Different currents running through the return paths 160, 162 cause a different voltage built up and as such the voltage drop over the electrical conductor varies from one conductor to the other. When L1 is a white LED and L2 is a green LED, for example, then their forward voltages are the same yet, as provided in this example, the white LED will draw more current than the green LED. There will be more current running through the return path to which the strings comprising the white LED are coupled, causing a greater voltage drop along the electrical conductor forming the return path over the length of the LED strip. As a result, the voltage drop over the resistor R2 will deviate from the voltage drop over the resistor R1 and this causes differences in the current running through the first LED string compared to the second LED string. These differences increase along the length of the strip, causing differences in light output of the LED strings and therefore color differences. In this example, in the first segment 120 the first LED string 130 outputs 10 lumen and so does the second LED string 132; yet in the final segment 122 the first LED string outputs 5 lumen while the second LED string 142 outputs 9 lumen. Both show a decrease in flux, yet the decrease is much larger over the length of the LED light strip for the first LED strings than for the second LED strings. In this example the first LED strings 130, 140 output white light and the second LED strings 132, 142 output green light. Towards the end of the LED light strip 110 there is relatively more green light emitted as part of the total light output of white and green light than at the beginning of the light strip.

To solve this inconsistent color rendering over the length of the LED strip, the resistance of the electrical conductor forming the return path 160 can be arranged to provide a different resistance than the electrical conductor forming the return path 162. For example, the electrical conductor can be made of a different material or the electrical conductor can be a trace, such as a trace printed on a (flexible) circuit board, and the thickness or the width of the trace can be adapted to influence the resistance of the trace. In the above example, by increasing the resistance of the return path to which the green LED strings are coupled relative to the resistance of the return path to which the white LED strings are coupled, the voltage drop over the LED strings along the length of the LED light strip 110 can be tuned to be the same for both types of LED strings.

A similar example can be provided for a LED light strip 110 comprising blue and red LED, where the forward voltage over the red LED is lower than that over the blue LED and each of these LEDs draws the same current. In such an example the LED light strip 110 will be designed such that the resistive element (e.g. resistor) in the red LED string has a greater resistance than the resistive element (resistor) in the blue LED string. The voltage drop over the combined supply and return path for the blue and red LED would be the same along the length of the strip, yet the effect would be that the current flowing through the red LED string would be greater than the current flowing through the blue LED string. This would cause a color shift to red along the length of the LED light strip 110.

Figure 2:
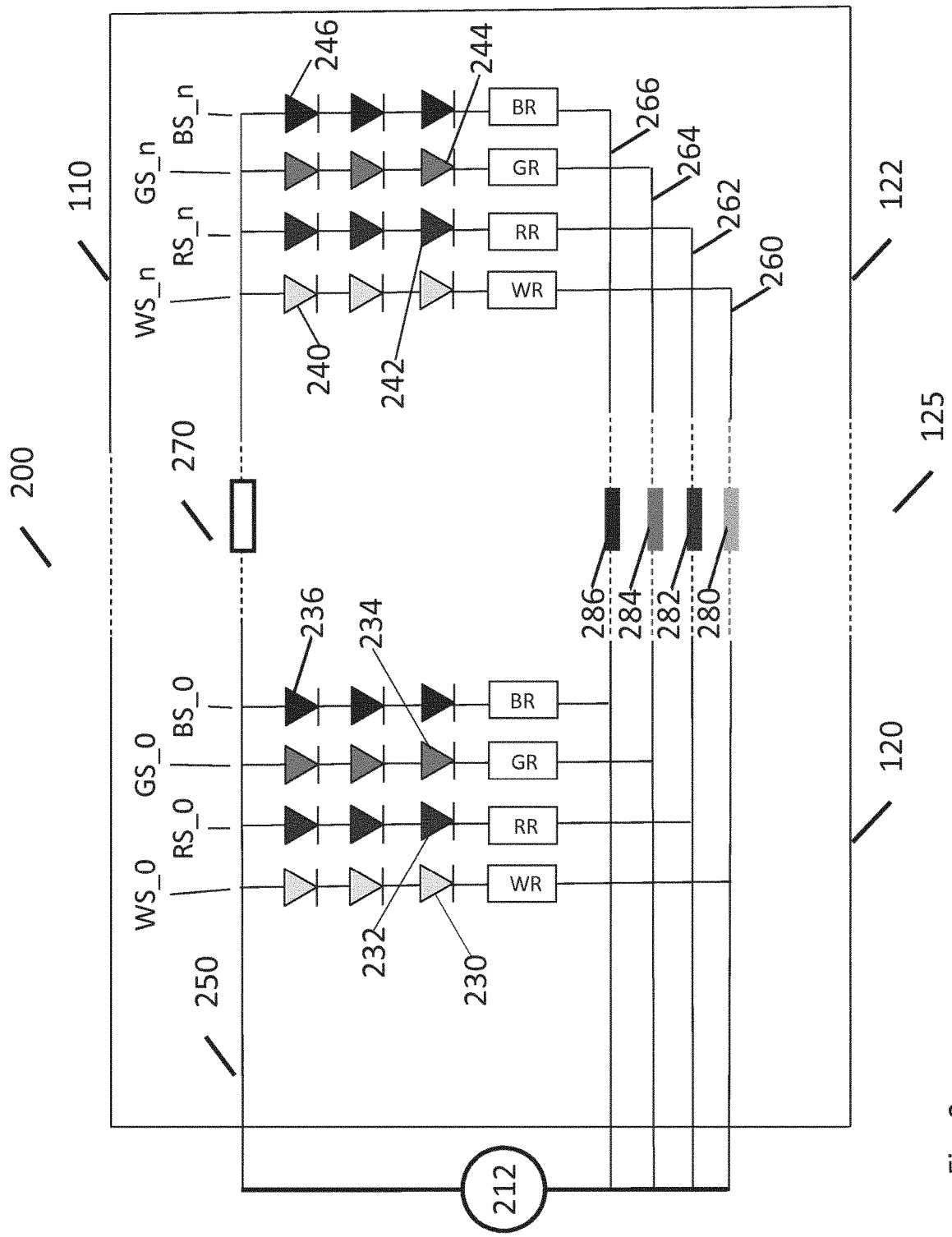
FIG. 2 shows schematically and exemplarily a LED light strip comprising red, green, blue and white LED.

In the lighting system 200 of FIG. 2 there are four colors rendered, i.e. white, red, green and blue, by four different types of LED strings. The strings are indicated as WS_0 for White String 0, RS_0 for Red String 0, GS_0 for Green String 0 and BS_0 for Blue String 0 in the first segment 120, respectively WS_n for White String n, RS_n for Red String n, GS_n for Green String n and BS_n for Blue String n in the final segment 122. Each LED string comprises three LED and one resistor in this example, yet in various embodiments can comprise the same, more or less LED and the same or more resistive elements (e.g. one or more resistors) in various configurations. The LED in WS_0 are referred to as LED 230 and the resistive element in WS_0 is referred to as WR in this FIG. 1. For RS_0 it is LED 232 and resistive element RR, for GS_0 it is LED 234 and resistive element GR, and for BS_0 it is LED 236 and resistive element BR respectively. For WS_n it is LED 240 and resistive element WR, for RS_n it is LED 242 and resistive element RR, for GS_n it is LED 244 and resistive element GR, and for BS_n it is LED 246 and resistive element BR respectively.

There is a single supply path 250 feeding the LED strings. There are separate return paths for each type of LED string, with WS_0 and WS_n coupled to return path 260, RS_0 and RS_n coupled to return path 262, GS_0 and GS_n coupled to return path 264, and BS_0 and BS_n coupled to return path 266 respectively. The resistive value of the electrical conductor making up the supply respectively return path is indicated by virtual resistors 270, 280, 282, 284, 286 (i.e. these do not represent a resistor being present in the circuit, yet for performing calculations in the circuit the resistance of the electrical conductor can be modeled as a resistor). Virtual resistor 270 is the resistive value of the supply path 250 from the side of the LED light strip closest to the voltage source 112 up to the final segment 122, similarly virtual resistors 280, 282, 284, 286 are the resistive values of the return paths 260, 262, 264, 266, respectively.

The current through a string is determined by the resistor according to the formula I=(V_supply−the combined forward voltages of the LED in the string)/R; where I is the current through the string, V_supply is the voltage supplied over the string, and the combined forward voltage over the LED in the string relates to the LED in series with the resistor. Other configurations, such as multiple LED in parallel, yet all in series with the same resistor, require slightly different formulas but adhere to the same basic principles.

Typically, the supply voltage of a LED light strip having a length of five meters or less is 12V and for strips over five meters it is 24V. A typical forward voltage of a white LED is 3V. With a 12V supply and 3 LEDs in series, there is a voltage drop of approximately 3V over the resistor. When there is a 24V supply instead of a 12V supply, there are 6 LED in series and 6V voltage drop over the resistor. For the avoidance of doubt, these are non-limiting examples only.

When the system 200 shown in FIG. 2 is powered by a 24V source 212 and the LED light strip is ten meters long, the effects of varying the resistance of the combined supply and return path for one type of LED string versus another is explained below and shown in FIGS. 3A and 3B, FIGS. 4A and 4B and FIGS. 5A and 5B.

Knowing all resistances and the voltage behavior of the LED, using Ohm's law and Kirchhoff's rules, the currents through the different LED strings can be calculated. The voltage delivered by the 24V source 212 to the LED strings of the first segment 120 is referred to as Vsupplypath,0 (which is 24V); and the voltage at the return path 266 for the white LED string of the first segment 120 is referred to as Vreturnpath_white,0 (which is 0V). The voltage at the supply path for LED string n in the last segment is referred to as Vsupplypath,n and the voltage at the return path 266 for the white LED string of the final segment 122 is referred to as Vreturnpath_white,n. The values for a LED string in segment 125 are referred to as respectively Vsupplypath,i and Vreturnpath_white,i; where i=1 for the segment after the first segment 120, i=2 for the segment thereafter, etc. up to i=n−1, which is the segment before the final segment 122. The segment after segment i will be referred to as segment j. The value of the virtual resistor 270 is referred to as Rsupplypath,i and the value of the virtual resistor 286 (for the supply path of the white LED strings) is referred to as Rreturnpath,i; i.e. the resistance of the supply path up to segment i is Rsupplypath,i and the resistance of the return path up to segment i is Rreturnpath,i (as seen from the first segment of the LED light strip). The current running through the first white LED string is indicated as Iwhite,0, for the next white LED string as Iwhite,1, etc. The current running through the LED strings of the other colors are referred to as Ired,i; Igreen,i; and Iblue,i for segment i. Vf,white refers to the forward voltage of all the white LED in a single white LED string (e.g. if the forward voltage of one white LED is 3V and there are three white LED in series then Vf,white=9V)

Then it follows that Vsupplypath,1=Vsupply,0−(Isupply,1*Rsupplypath,1) and Vsupplypath,i=Vsupplypath,0−Σj=1−i Isupplypath,j*Rsupplypath,j. The current running through the supply path of the first segment is determined Isupplypath,total=Σj=1−n (Ired,j+Igreen,j+Iblue,j+Iwhite,j).

Likewise, Vreturnpath_white,1=Vreturnpath_white,0+Iwhite,1*Rreturnpath_white,1. The current running through a white LED string is then Iwhite,1=(Vsupplypath,1−Vwhite,1)−3*Vf,white)/returnpath_white,1. The current running through the return path to which the first white LED string is coupled is then determined as Ireturnpath_white,0=Σj=0−n Iwhite,j.

The current running through the white LED string in the segment after the first segment is then Iwhite,1=(Vsupplypath,1−Vreturnpath_white,1)−Vf,white)/Rreturnpath_white,1.

The voltage drop over a white LED string i, can then be expressed as ΔVwhite,i=Vsupplypath,i−Vwhite,i=(Vsupplypath,0−Σj=1−i Isupplypath,j*Rsupplypath,j)−(Vw,0+Σj=1−i Ireturnpath_white,j*Rreturnpath_white,j). Wherein Isupplypath,i=Isupplypath,total−Σj=1−i (Ired,j+Igreen,j+Iblue,j+Iwhite,j). The formulas for ΔIVred,i; ΔVgreen,i; and ΔVblue,i are similar to ΔVwhite,i.

The resulting voltage drop ΔV and current through the different strings of colors is simulated over length for a 10 meter LED strip. Since the LED current is a good indicator for the flux, the relative decrease of the current should be the same for all different colors to prevent color changes over length. In all simulations, the assumed supply voltage is 24V (6 LEDs in series) and the LEDs have a pitch of 5.55 cm. The trace heights are assumed to be 70 μm. It is further assumed that the flame white and the cool white LEDs have a significantly higher current of 80 mA than the red, green and blue LEDs that are driven at 20 mA.

Figure 3A:
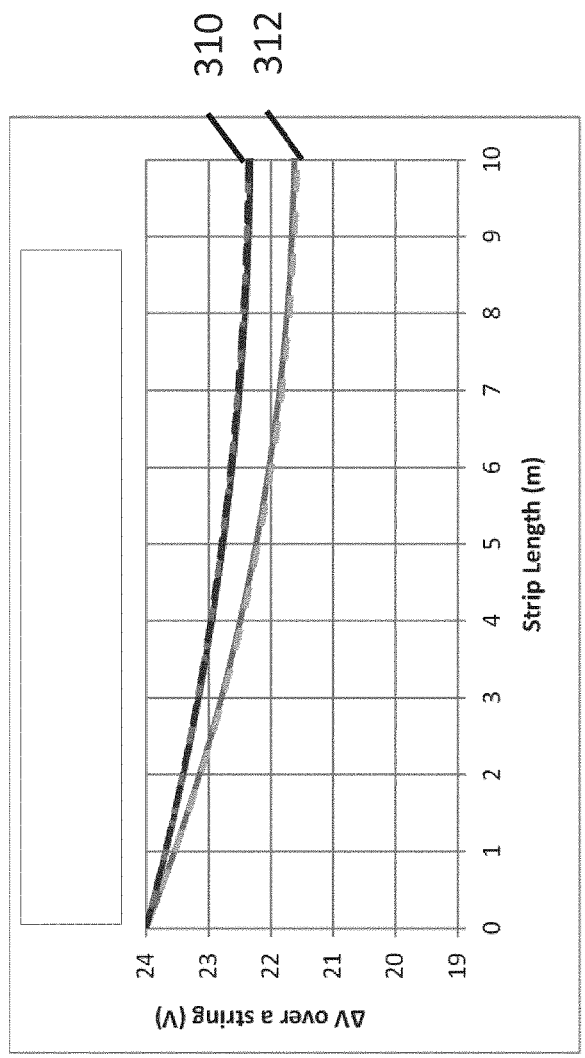
FIGS. 3A and 3B show schematically and exemplarily a graph of the voltage drop respectively the relative current through the various LED strings in a LED light strip wherein all return paths have the same resistance.
Figure 3B:
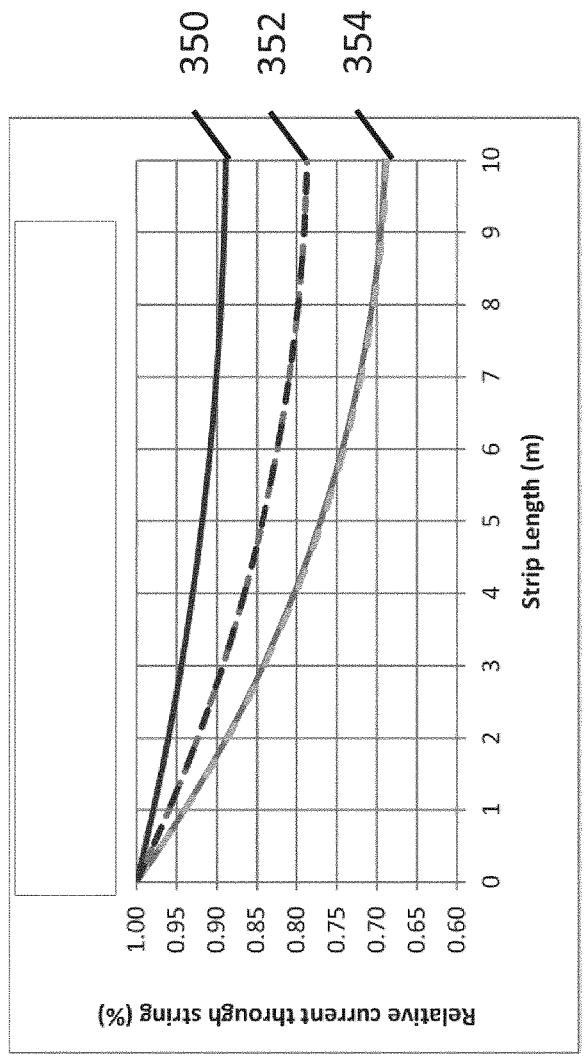

In FIGS. 3A, 3B, 4A, 4B, 5A and 5B, the results of the simulation are shown. The only variables changing are the resistance of the supply and return paths of the different colors. In FIG. 3A the voltage drop over length for the different colors are indicated in case of a supply path trace width of 5 mm. The return path traces have a width of 2.25 mm. The behavior of the voltage drop over the red, green and blue are the same and the drop is less severe than that of the white. This can be explained by the fact that the currents through the red, green and blue are the same and lower than the current through the white. Hence, the total current running through the white return path is larger than that of the colored return paths. With the same resistances, the voltage built-up is larger and therefore the voltage drop will be larger. FIG. 3B shows the resulting current behavior over length. Since blue and green LEDs have the same forward voltage and same currents, the current behavior over length is the same. The white LED have the same forward voltage, but since the voltage decays faster over length, the current decay is also faster. Finally, the red current decay is slower than the green and blue because the forward voltage of the red LED is lower. With the same number of LED in series, the voltage drop over the resistor in series with the red LED is higher. As a result, although the absolute voltage decay of the voltage over the resistor is similar to that of the green and blue LED, the relative decrease is much lower and therefore, the current decay is slower. In the end the color shift over the length of the strip will be slightly towards the blue/green, but mainly towards the red color point.

Figure 4A:
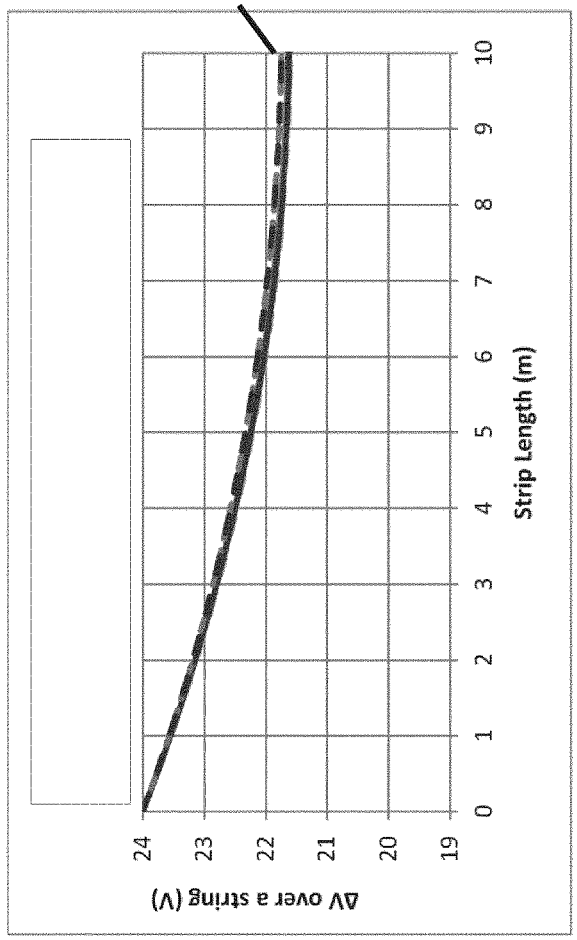
FIGS. 4A and 4B show schematically and exemplarily a graph of the voltage drop respectively the relative current through the various LED strings in a LED light strip wherein the return path of the white LED strings has a lower resistance than each of the other return paths.
Figure 4B:
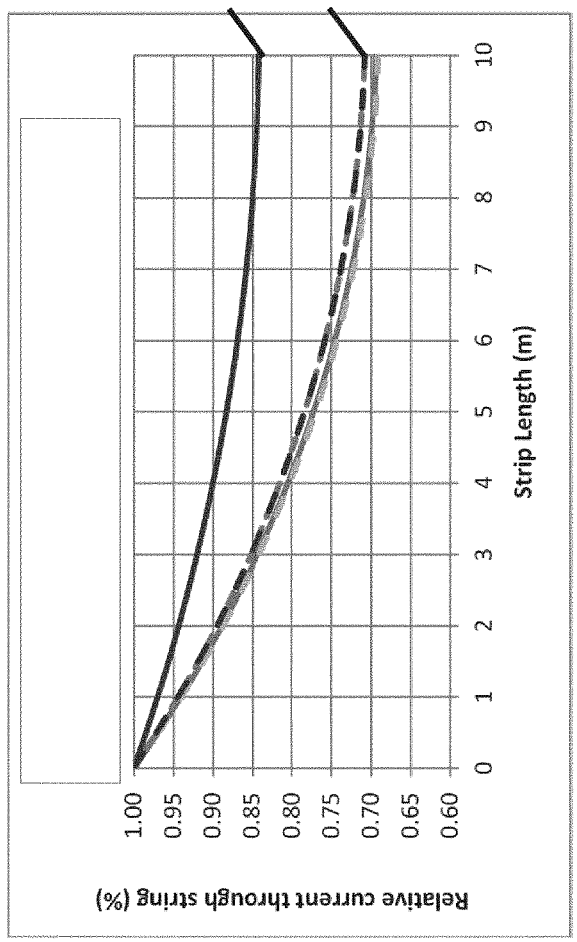

The dependency of the voltage drop on different drive currents per LED string can be solved by adjusting the resistance of the supply and return path (e.g. the width of the traces). FIG. 4A shows the resulting voltage drop and FIG. 4B the resulting current drop when reducing the trace dimensions of the red, green and blue return path trace from 2.25 mm down to 0.65 mm while keeping the white return path trace at 2.25 mm and the supply path trace at 5 mm. The voltage drop of all different colors are now the same. Because of similarity in forward voltage, the current decay of the green, blue and white is also the same.

Above shows how the color shift as a result of different drive currents could be corrected for by adjusting the trace dimensions. However, the color shift due to the different forward voltage of the red LED compared to the green, blue and white LED remains to be solved. Due to the lower forward voltage of the red LED, the current decay of the red LED string will be slower. This would mean that the color over the length of the strip would move towards the red.

Figure 5A:
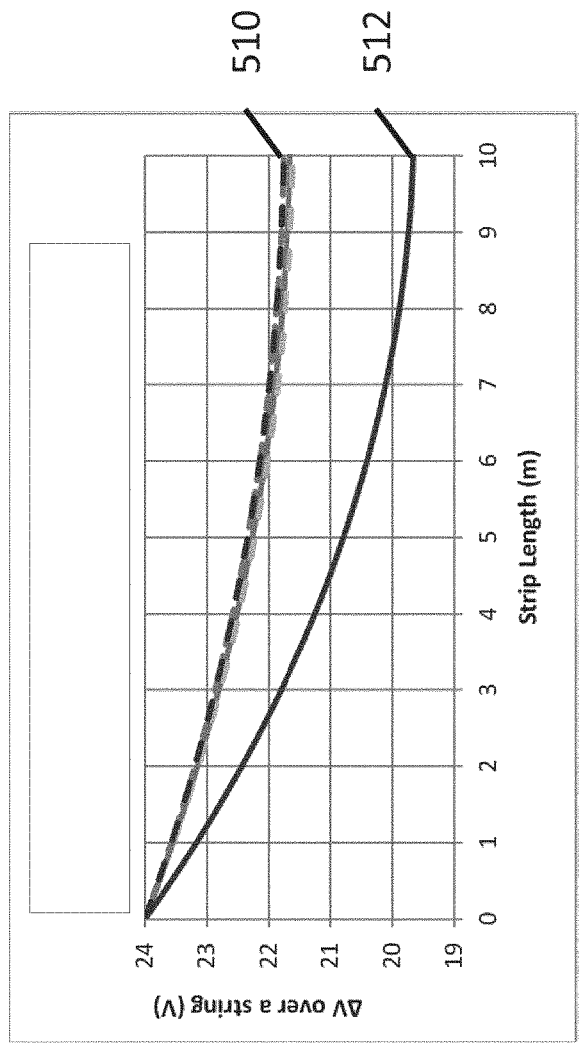
FIGS. 5A and 5B show schematically and exemplarily a graph of the voltage drop respectively the relative current through the various LED strings in a LED light strip wherein the return path of the white LED strings has a lower resistance than the other return paths and further the return path of the red LED strings has a higher resistance than each of the return paths of the green and blue LED strings.
Figure 5B:
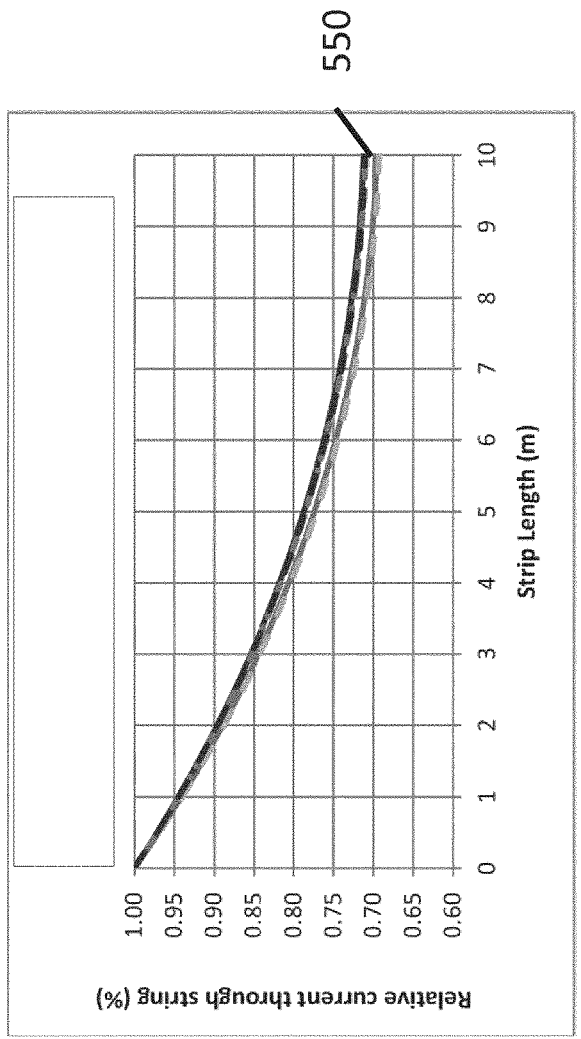

To solve this red shift over length the resistance of the red return path trace can be increased by decreasing the trace width. In FIGS. 5A and 5B, the red return path trace width is reduced from 0.65 mm to 0.20 mm. The other dimensions are the same as for the LED light strip featured in FIGS. 4A and 4B. As a result, the voltage drop over the red string is faster than over the other colors and tuned so that the current decay over length is similar to that of the other colors. This way, the color shift over length is minimized and will only depend on deviations of the actual forward voltage bin differences between the different colors.

In this example the total LED strip width is reduced from 17.25 mm (for the LED light strip with the characteristics according to FIGS. 3A and 3B) down to 12 mm (for the LED light strip with the characteristics according to FIGS. 5A and 5B). This comes at a cost of lumen decay, which in the above example is about 30% over a length of 10 m. If a lower lumen decay is preferred, the trace resistances need to be decreased, hence the trace widths need to be increased amounting to an increased width of the strip.

The invention claimed is:
1. A light emitting diode (LED) light strip comprising:
a first plurality of LED strings arranged for being powered in parallel through a supply path and a first return path, each LED string of the first plurality of LED strings comprising at least one first LED having a first forward voltage and a first drive current when the at least one first LED has a voltage drop equal to the first forward voltage;
a second plurality of LED strings arranged for being powered in parallel through the supply path and a second return path, each LED string of the second plurality of LED strings comprising at least one second LED having a second forward voltage and a second drive current when the at least one second LED has a voltage drop equal to the second forward voltage, at least one of the first and second forward voltages or the first and second drive currents being different;
at least three electrical conductors positioned along a length of the LED light strip, a first electrical conductor of the at least three electrical conductors arranged to provide the supply path for the first plurality of LED strings and the second plurality of LED strings, a second electrical conductor of the at least three electrical conductors arranged to form the first return path for the first plurality of LED strings and a third electrical conductor of the at least three electrical conductors arranged to form the second return path for the second plurality of LED strings, a first set of at least two electrical conductors of the at least three electrical conductors having a first combined resistance, and a second set of at least two electrical conductors of the at least three electrical conductors having a second combined resistance, wherein a resistance of the second electrical conductor is less than a resistance of the third electrical conductor;
a first segment at a first position on the LED light strip, the first segment comprising at least a first LED string from the first plurality of LED strings coupled to the supply path and the first return path and at least a first LED string from the second plurality of LED strings coupled to the supply path and the second return path; and
a second segment at a second position on the LED light strip different from the first position, the second segment comprising at least a second LED string from the first plurality of LED strings coupled to the supply path and the first return path, and at least a second LED string from the second plurality of LED strings coupled to the supply path and the second return path;
wherein the first and second LED strings from the first plurality of LED strings have a first relative decrease in current compared to each other when a voltage source is provided to the supply and return paths, and the first and second LED strings from the second plurality of LED strings have a second relative decrease in current compared to each other when the voltage source is provided to the supply and return paths; and wherein the first and second combined resistances are different such that the difference between the first and second relative decreases in currents is less than what the difference between the first and second relative decreases would be if the first and second combined resistances were the same.

2. The LED light strip according to claim 1, wherein the at least three electrical conductors are of the same material, wherein the cross-section area of the first electrical conductor of the at least three electrical conductors is different from the other electrical conductors of the at least three electrical conductors.

3. The LED light strip according to claim 2, wherein the at least three electrical conductors are traces on a printed circuit board, and the width of the first electrical conductor is different from the other electrical conductors of the at least three electrical conductors.

4. The LED light strip according to claim 3, wherein the width of each electrical conductor of the at least three electrical conductors remains the same along the length of the LED light strip.

5. The LED light strip according to claim 1, wherein the at least one first LED of each LED string of the first plurality of LED strings emits, in operation, a first color of light, and the at least one second LED of each LED string of the second plurality of LED strings emits, in operation, a second color of light different from the first color of light.

6. The LED light strip according to claim 5, wherein the first color of light is white light, and the first drive current is greater than the second drive current, and wherein the first combined resistance is less than the second combined resistance.

7. The LED light strip according to claim 5, wherein the first color of light is red light, and the first forward voltage is less than the second forward voltage, and wherein the first combined resistance is greater than the second combined resistance.

8. A system comprising a LED light strip according to claim 1, and further comprising a driver for providing the voltage source to the LED light strip.

9. The LED light strip according to claim 1, wherein the length of the LED light strip is greater than one meter.

10. The LED light strip according to claim 6, wherein the second color of light is one of red, green, or blue light.

11. The LED light strip according to claim 1, wherein the first and second relative decreases in current are the same.

12. The LED light strip according to claim 1, further comprising:
a third plurality of LED strings arranged for being powered in parallel through the supply path and a third return path, each LED string of the third plurality of LED strings comprising at least one third LED having a third forward voltage and a third drive current when the at least one third LED has a voltage drop equal to the third forward voltage, at least one of the first and third forward voltages or the first and third drive currents being different, and at least one of the second and third forward voltages or the second and third drive currents being different;
at least a fourth electrical conductor in the at least three electrical conductors, the fourth electrical conductor in the at least three electrical conductors arranged to form the third return path, a third set of at least two electrical conductors of the at least four electrical conductors having a third combined resistance;
wherein the first segment further comprises at least a first LED string from the third plurality of LED strings, and the second segment further comprises at least a second LED string from the third plurality of LED strings;
wherein the first and second LED strings from the third plurality of LED strings have a third relative decrease in current compared to each other when the voltage source is provided to the third supply and return paths; and
wherein the first, second, and third combined resistances are each different such that the differences between the first, second, and third relative decreases in current are less than what the differences between the first, second, and third relative decreases would be if the first, second, and third combined resistances were the same.

13. The LED light strip according to claim 12, wherein the first, second, and third relative decreases in current are the same.

14. The LED light strip according to claim 12, wherein the at least one first LED of each LED string of the first plurality of LED strings emits, in operation, a first color of light, the at least one second LED of each LED string of the second plurality of LED strings emits, in operation, a second color of light different from the first color of light, and the at least one third LED of each LED string of the third plurality of LED strings emits, in operation, a third color of light different from both the first and second colors of light.

15. The LED light strip according to claim 1, wherein each LED string of the first plurality of LED strings further comprises at least one resistive component, and each LED string of the second plurality of LED strings further comprises at least one resistive component.

16. The LED light strip according to claim 1, wherein each LED string of the first plurality of LED strings comprises a plurality of first LEDs each having the first forward voltage and the first drive current when a voltage drop across each of the plurality of first LEDs is equal to the first forward voltage, and each LED string of the second plurality of LED strings comprises a plurality of second LEDs each having the second forward voltage and the second drive current when a voltage drop across each of the plurality of second LEDs is equal to the second forward voltage.

17. The LED light strip according to claim 1, wherein the first position is at a first end of the LED light strip, and the second position is at a second end of the LED light strip opposite the first end, and wherein the first end includes a voltage source input.

18. A method of manufacturing a light emitting diode (LED) light strip, the method comprising:
printing at least three traces on a circuit board, the at least three traces arranged for providing at least three electrical conductors positioned along a length of the LED light strip; and
populating the circuit board with a least:
a first plurality of LED strings arranged for being powered in parallel through a supply path and a first return path, each LED string of the first plurality of LED strings comprising at least one first LED having a first forward voltage and a first drive current when the at least one first LED has a voltage drop equal to the first forward voltage; and
a second plurality of LED strings arranged for being powered in parallel through the supply path and a second return path, each LED string of the second plurality of LED strings comprising at least one second LED having a second forward voltage and a second drive current when the at least one second LED has a voltage drop equal to the second forward voltage, at least one of the first and second forward voltages or the first and second drive currents being different;

wherein a first electrical conductor of the at least three electrical conductors is arranged to provide the supply path for the first plurality of LED strings and the second plurality of LED strings, a second electrical conductor of the at least three electrical conductors is arranged to form the first return path for the first plurality of LED strings and a third electrical conductor of the at least three electrical conductors is arranged to form the second return path for the second plurality of LED strings, a first set of at least two electrical conductors of the at least three electrical conductors having a first combined resistance, and a second set of at least two electrical conductors of the at least three electrical conductors having a second combined resistance, wherein a resistance of the second electrical conductor is less than a resistance of the third electrical conductor;

wherein the first plurality of LED strings comprises a first LED string populated on a first segment at a first position on the LED light strip and coupled to the supply path and the first return path, and the second plurality of LED strings comprises a first LED string populated on the first segment coupled to the supply path and the second return path;

wherein the first plurality of LED strings comprises a second LED string populated on a second segment at a second position on the LED light strip different from the first position and coupled to the supply path and the first return path, and the second plurality of LED strings comprises a second LED string populated on the second segment coupled to the supply path and the second return path;

wherein the first and second LED strings from the first plurality of LED strings have a first relative decrease in current compared to each other when a voltage source is provided to the supply and return paths, and the first and second LED strings from the second plurality of LED strings have a second relative decrease in current compared to each other when the voltage source is provided to the supply and return paths; and wherein the first and second combined resistances are different such that the difference between the first and second relative decreases in current is less than what the difference between the first and second relative decreases would be if the first and second combined resistances were the same.

\* \* \* \* \*